(12) United States Patent
Tanaka et al.

(10) Patent No.: US 8,518,762 B2
(45) Date of Patent: Aug. 27, 2013

(54) SEMICONDUCTOR DEVICE AND MANUFACTURING METHOD THEREOF

(75) Inventors: Tetsuhiro Tanaka, Kanagawa (JP); Yuta Endo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/171,834

(22) Filed: Jun. 29, 2011

(65) Prior Publication Data

US 2012/0001335 A1 Jan. 5, 2012

(30) Foreign Application Priority Data

Jul. 2, 2010 (JP) ................................. 2010-151894

(51) Int. Cl.
*H01L 21/00* (2006.01)
*H01L 21/84* (2006.01)

(52) U.S. Cl.
USPC ........... 438/153; 438/627; 438/643; 438/653; 257/E21.592

(58) Field of Classification Search
USPC ................ 438/656, 675, 153, 627, 643, 653; 257/761, E23.01, 762, E21.158, E21.592
See application file for complete search history.

(56) References Cited

U.S. PATENT DOCUMENTS

| | | | | |
|---|---|---|---|---|
| 5,477,419 A * | 12/1995 | Goodman et al. | ............ | 361/760 |
| 6,090,701 A * | 7/2000 | Hasunuma et al. | ............ | 438/632 |
| 6,153,893 A | 11/2000 | Inoue et al. | | |
| 6,248,656 B1 * | 6/2001 | Baker et al. | .................... | 438/611 |
| 6,306,756 B1 | 10/2001 | Hasunuma et al. | | |
| 6,468,839 B2 | 10/2002 | Inoue et al. | | |
| 6,506,675 B1 * | 1/2003 | Oomiya et al. | ............... | 438/677 |
| 6,576,924 B1 * | 6/2003 | Yamazaki et al. | .............. | 257/59 |
| 6,891,270 B2 | 5/2005 | Sugawara et al. | | |
| 7,214,574 B2 * | 5/2007 | Yamazaki et al. | ............ | 438/166 |
| 7,384,862 B2 | 6/2008 | Yamazaki | | |
| 7,551,655 B2 | 6/2009 | Tanaka et al. | | |
| 7,842,528 B2 | 11/2010 | Fujikawa et al. | | |
| 2002/0072228 A1 * | 6/2002 | Kuo | .............................. | 438/669 |
| 2005/0012097 A1 | 1/2005 | Yamazaki | | |
| 2007/0018219 A1 * | 1/2007 | Lim et al. | ...................... | 257/296 |
| 2008/0284709 A1 | 11/2008 | Yamazaki | | |
| 2009/0033818 A1 | 2/2009 | Nakajima et al. | | |
| 2009/0057683 A1 | 3/2009 | Nakajima et al. | | |
| 2009/0061574 A1 | 3/2009 | Nakajima et al. | | |
| 2009/0206379 A1 * | 8/2009 | Kitazaki et al. | ............... | 257/295 |
| 2009/0315144 A1 * | 12/2009 | Wang | ............................ | 257/532 |
| 2010/0136780 A1 * | 6/2010 | Natori et al. | .................. | 438/591 |
| 2010/0193785 A1 * | 8/2010 | Kimura | .......................... | 257/43 |

(Continued)

FOREIGN PATENT DOCUMENTS

| | | |
|---|---|---|
| EP | 0 535 979 A2 | 4/1993 |
| JP | 5-129608 | 5/1993 |

(Continued)

*Primary Examiner* — Jarrett Stark
*Assistant Examiner* — Shahed Ahmed
(74) *Attorney, Agent, or Firm* — Husch Blackwell LLP

(57) ABSTRACT

Provided is a method for manufacturing a semiconductor device having favorable electric characteristics with a high yield. A groove and/or a contact hole reaching a semiconductor region or a conductive region is formed in an insulating film covering the semiconductor region or the conductive region; a first conductive film is formed in the groove and/or the contact hole; the first conductive film is exposed to plasma generated from a mixed gas of an oxidizing gas and a halogen-based gas and to an atmosphere containing water to be fluidized partially or entirely; and a second conductive film is formed over the first conductive film.

25 Claims, 6 Drawing Sheets

(56) References Cited

U.S. PATENT DOCUMENTS

| | | |
|---|---|---|
| 2011/0065221 A1 | 3/2011 | Fujikawa et al. |
| 2012/0001332 A1 | 1/2012 | Tanaka |

FOREIGN PATENT DOCUMENTS

| | | |
|---|---|---|
| JP | 7-130851 | 5/1995 |
| JP | 7-131030 | 5/1995 |
| JP | 8-316233 | 11/1996 |
| JP | 2001-53283 | 2/2001 |
| JP | 2001-102383 | 4/2001 |
| JP | 2005-49832 | 2/2005 |
| JP | 2005-191546 | 7/2005 |

\* cited by examiner

SEMICONDUCTOR DEVICE AND MANUFACTURING METHOD THEREOF

BACKGROUND OF THE INVENTION

1. Field of the Invention

The present invention relates to a semiconductor device and a method for manufacturing the semiconductor device.

In this specification, a semiconductor device means all types of devices which can function by utilizing semiconductor characteristics: a display device, an electro-optical device, a photoelectric conversion device, a semiconductor circuit, and an electronic appliance are all semiconductor devices.

2. Description of the Related Art

The size of a thin film transistor has been reduced for improving productivity and saving size of a semiconductor device. As the size of a thin film transistor is reduced, the structure of the thin film transistor needs to be miniaturized, so that covering with a wiring and the like is difficult. For example, reflow using aluminum is used as a technique of filling a contact hole (see Patent Document 1). When the reflow is performed using a material with a low melting point such as aluminum is used, a diffusion prevention film formed using titanium, titanium nitride, or the like needs to be formed between a semiconductor film and the material with a low melting point in order to prevent diffusion of the material with a low melting point into the semiconductor film.

REFERENCE

Patent Document

[Patent Document 1] Japanese Published Patent Application No. H07-130851

SUMMARY OF THE INVENTION

A wiring material with a low resistance is used to manufacture a thin film transistor in order not to cause wiring delay. Typical examples of the wiring material with a low resistance are a metal such as copper, aluminum or silver, an alloy containing any of these, and a metal compound material containing any of these. When the wiring material with a low resistance is used, diffusion of the wiring material with a low resistance into a semiconductor film becomes a problem. In order to solve the problem, a diffusion prevention film having conductivity needs to be formed between the semiconductor film and the wiring. If the wiring material with a low resistance is diffused into the semiconductor film, off-state current of the thin film transistor is increased. As the semiconductor film, an amorphous silicon film, a microcrystalline silicon film, a polycrystalline silicon film, a single crystal silicon film, an amorphous germanium film, a microcrystalline germanium film, a polycrystalline germanium film, a single crystal germanium film, a mixture film thereof, or the like is used.

As a thin film transistor is further miniaturized to improve productivity and to save size of a semiconductor device, it becomes difficult to form a diffusion prevention film uniformly on side surfaces and a bottom surface of a groove and a contact hole.

The diffusion prevention film having conductivity is formed by a sputtering method, an atomic layer deposition (ALD) method, or the like, for example.

A sputtering method is widely used to form a conductive film for the reasons as follows: deposition rate is high; an apparatus has a relatively simple structure and is inexpensive; and a large area can also be processed by a sputtering method.

When a film is formed by a sputtering method, the film has such a problem that a groove and a contact hole have an overhang shape and that the film is not deposited uniformly on the side surfaces and the bottom surface of the groove and the contact hole. When a portion where coverage with a diffusion prevention film is insufficient is generated, diffusion of the wiring material with a low resistance into the semiconductor film is caused, leading to an increase in off-state current of a thin film transistor.

On the other hand, a fine groove and a fine contact hole in a film formed by an ALD method do not have an overhang shape, and the film can be deposited uniformly on the side surface and the bottom surface of the groove and the contact hole. However, as compared to a sputtering method, an apparatus used in an ALD method is expensive, a large area is hard to be processed by an ALD method, and deposition rate of an ALD method is low.

In view of the above, an object of one embodiment of the present invention is to form a diffusion prevention film uniformly on the side surfaces and the bottom surface of a groove and a contact hole.

Another object of one embodiment of the present invention is to provide a method for manufacturing a semiconductor device which has excellent electric characteristics with a high yield.

According to one embodiment of the present invention, the following is performed: a groove and/or a contact hole reaching a semiconductor region or a conductive region is formed in an insulating film covering the semiconductor region or the conductive region; a first conductive film is formed in the groove and/or the contact hole; an oxide of a metal material contained in the first conductive film is formed by exposing the first conductive film to plasma generated from a mixed gas of an oxidizing gas and a halogen-based gas; the first conductive film containing the oxide of a metal material is exposed to an atmosphere containing water to be fluidized; and a second conductive film is formed over the first conductive film.

According to one embodiment of the present invention, the following is performed: a semiconductor film is formed over a substrate; a gate insulating film covering the semiconductor film is formed; a gate electrode is formed over the semiconductor film with the gate insulating film provided therebetween; an insulating film covering the gate electrode and the gate insulating film are formed; a groove and/or a contact hole is formed by etching parts of the insulating film and the gate insulating film; a first conductive film in contact with the semiconductor film through the groove and/or the contact hole is formed over the insulating film; an oxide of a metal material contained in the first conductive film is formed by exposing a surface of the first conductive film to plasma generated from a mixed gas of an oxidizing gas and a halogen-based gas; the first conductive film containing the oxide of a metal material is exposed to an atmosphere containing water to be fluidized; and a second conductive film is formed over the first conductive film after the fluidized first conductive film is solidified. The second conductive film is an aluminum film, a copper film, a silver film, an alloy film mainly containing aluminum, an alloy film mainly containing copper, or an alloy film mainly containing silver.

Note that an impurity semiconductor region functioning as a source region and a drain region may be formed by using the gate electrode as a mask and introducing an impurity into the semiconductor film through the gate insulating film.

Note that the first conductive film comprises one or more metal elements selected from titanium, nickel, zinc, gallium, zirconium, niobium, molybdenum, indium, tin, and tungsten. A titanium film or a titanium nitride film is preferably used for the first conductive film.

The first conductive film functions as a diffusion prevention film for preventing a material of the second conductive film from diffusing into the semiconductor film.

In addition, an oxide is formed in such a manner that the first conductive film reacts with plasma generated from a mixed gas of an oxidizing gas and a halogen-based gas.

In one embodiment of the present invention, the oxidizing gas is a gas containing at least any one of oxygen, water, ozone, and nitrous oxide.

The insulating film contains at least any one of silicon oxide, silicon oxynitride, silicon nitride, silicon nitride oxide, aluminum oxide, aluminum nitride, a polyimide-based resin, an acrylic-based resin, and a siloxane-based resin.

Silicon oxynitride refers to a substance that contains a larger amount of oxygen than that of nitrogen. For example, silicon oxynitride contains oxygen, nitrogen, silicon, and hydrogen at concentrations in ranges of greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. In addition, silicon nitride oxide refers to a substance that contains a larger amount of nitrogen than that of oxygen. For example, silicon nitride oxide contains oxygen, nitrogen, silicon, and hydrogen at concentrations in ranges of greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that the ranges are obtained by measurement using Rutherford backscattering spectrometry (RBS) and hydrogen forward scattering spectrometry (HFS). In addition, the total of the percentages of the constituent elements does not exceed 100 atomic %.

Note that when the insulating film contains oxygen or water, the oxidizing gas can be supplied from the insulating film to the first conductive film.

In addition, an oxidizing gas remaining in a chamber for generating plasma may be used as the oxidizing gas.

In one embodiment of the present invention, the halogen-based gas means a gas containing halogen. Typically, a gas containing at least any one of carbon tetrafluoride, sulfur fluoride, nitrogen fluoride, trifluoromethane, octafluorocyclobutane, chlorine, boron trichloride, silicon chloride, and carbon tetrachloride is used. A carbon tetrafluoride gas is preferably used.

The second conductive film is an aluminum film, a copper film, a silver film, an alloy film mainly containing aluminum, an alloy film mainly containing copper, or an alloy film mainly containing silver.

In one embodiment of the present invention, an oxide of the first conductive film contains fluorine or chlorine at a concentration of higher than or equal to $1 \times 10^{19}$ atoms/cm$^3$.

According to one embodiment of the present invention, a first conductive film is fluidized and then is solidified (also referred to as reflowed), so that a diffusion prevention film can be uniformly formed on the side surfaces and the bottom surface of a groove and a contact hole.

According to one embodiment of the present invention, reflow using a material with a melting point higher than a strain point of a substrate can be performed.

According to one embodiment of the present invention, a diffusion prevention film can be uniformly formed on the side surfaces and the bottom surface of a groove and a contact hole; thus, even when a wiring material with a low resistance is used, an increase of off-state current due to diffusion of the wiring material with a low resistance into a semiconductor film or to the periphery of the semiconductor film can be suppressed. Accordingly, a semiconductor device having favorable electric characteristics can be manufactured with a high yield.

DETAILED DESCRIPTION OF THE INVENTION

Figure 1:
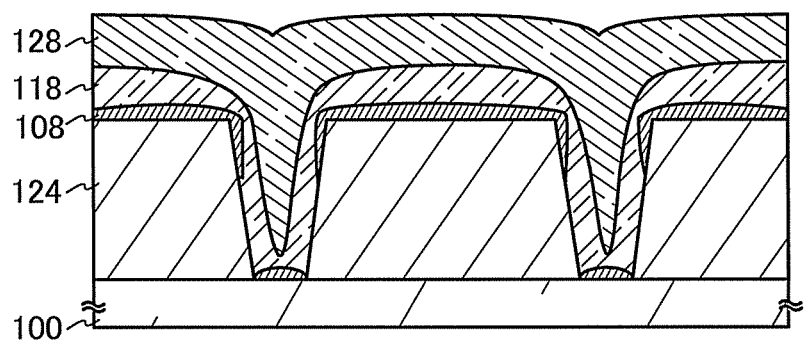
FIG. 1 is a cross-sectional view showing a semiconductor device according to one embodiment of the present invention.

Hereinafter, embodiments of the present invention will be described in detail with reference to the accompanying drawings. Note that the present invention is not limited to the description below and it is easily understood by those skilled in the art that the mode and details can be changed variously. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Embodiment 1

In this embodiment, a cross-sectional structure of a semiconductor device according to one embodiment of the present invention will be described with reference to FIG. 1.

FIG. 1 shows a cross-sectional view of a semiconductor device including a substrate 100, an insulating film 124, a groove or a contact hole formed in the insulating film 124, a conductive film 118, and a conductive film 128. A conductive film 108 may be formed between the insulating film 124 and the conductive film 118 and/or between the substrate 100 and the conductive film 118.

As the substrate 100, a glass substrate, a ceramic substrate, or a plastic substrate over which a semiconductor region or a conductive region is provided can be used. Alternatively, a silicon wafer, an SOI (silicon on insulator) substrate, a semiconductor substrate such as a gallium arsenide substrate can be used. Further alternatively, a metal substrate of a stainless alloy or the like can be used. As the glass substrate, for example, an alkali-free glass substrate formed using barium borosilicate glass, aluminoborosilicate glass, aluminosilicate glass, or the like is preferably used. Note that there is no limitation on the size of the substrate 100. For example, any of glass substrates of the third to tenth generations which are often used in the field of the flat panel display can be used.

The insulating film 124 can be formed of a single-layer structure or a stacked-layer structure of an inorganic film containing silicon oxide, silicon oxynitride, silicon nitride oxide, silicon nitride, aluminum oxide, aluminum nitride, or the like, or an organic film containing a polyimide-based resin, an acrylic-based resin, a siloxane-based resin, or the like.

The conductive film 108 comprises one or more metal elements selected from titanium, nickel, zinc, gallium, zirconium, niobium, molybdenum, indium, tin, and tungsten. A titanium film or a titanium nitride film is preferably used for the conductive film 108.

The conductive film 118 comprises one or more metal elements selected from titanium, nickel, zinc, gallium, zirconium, niobium, molybdenum, indium, tin, and tungsten.

The conductive film 118 is an oxide film formed of a material of the conductive film 108. For example, when the conductive film 108 is a titanium film or a titanium nitride film, the conductive film 118 is a titanium oxide film.

The conductive film 128 can be formed using an aluminum film, a copper film, a silver film, or an alloy film of these.

The conductive film 108 and/or the conductive film 118 functions as a diffusion prevention film against a material of the conductive film 128.

Next, a method for manufacturing the semiconductor device will be described with reference to FIGS. 2A to 2E.

Figure 2A:
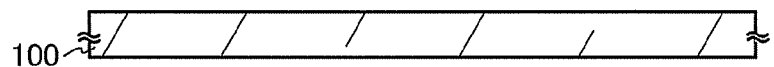
FIGS. 2A to 2E are cross-sectional views showing a method for manufacturing a semiconductor device according to one embodiment of the present invention.
Figure 2B:
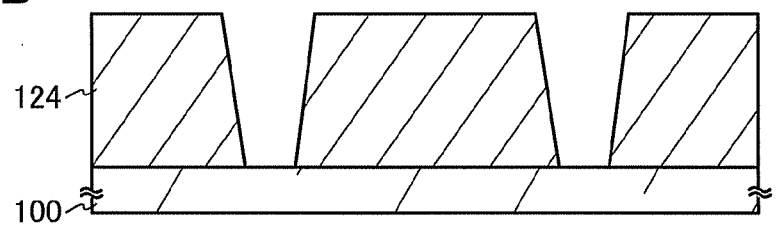
Figure 2C:
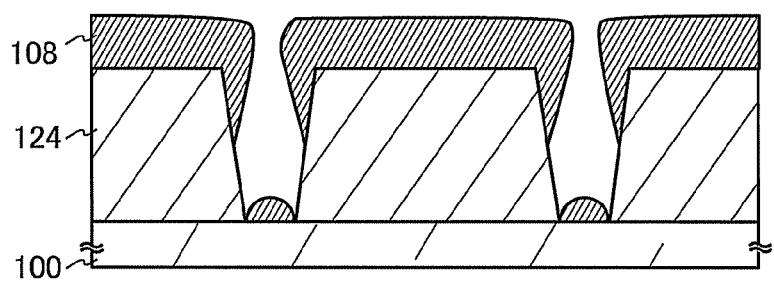
Figure 2D:
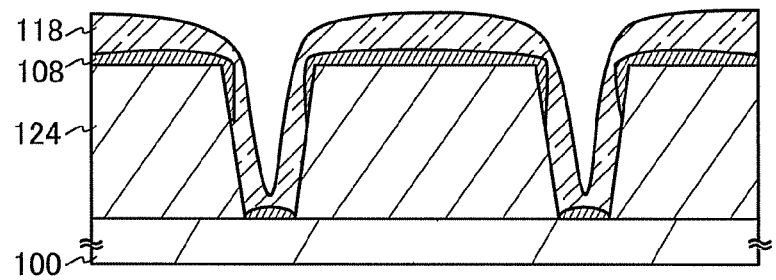

As shown in FIG. 2A, the substrate 100 including a semiconductor region or a conductive region is prepared.

Next, the insulating film 124 is formed over the substrate 100 to have a thickness of greater than or equal to 50 nm and less than or equal to 3 μm, preferably greater than or equal to 300 nm and less than or equal to 1 μm.

The insulating film 124 can be formed by a CVD method or a sputtering method.

Next, a resist mask is formed over the insulating film 124 by a photolithography method, an inkjet method, or the like, and the insulating film 124 is etched using the mask, whereby the groove or the contact hole can be formed. Ultraviolet, a KrF laser light, an ArF laser light, or the like is preferably used for light exposure for forming the resist mask.

In the case where light exposure is performed so that a width of the groove and a diameter of the contact hole are less than 25 nm, the light exposure for forming the resist mask is preferably performed using, for example, extreme ultraviolet having an extremely short wavelength of several nanometers to several tens of nanometers. In the light exposure by extreme ultraviolet, the resolution is high and the focus depth is large. Therefore, the width of the groove and the diameter of the contact hole which are formed later can be reduced.

Dry etching is preferably performed on the insulating film 124 for forming the groove and the contact hole. With dry etching, shape of the groove and the contact hole can be easily controlled. Further, etching is performed while side walls of the resist mask are made to recede, so that the groove and the contact hole can be tapered (see FIG. 2B).

Note that the groove can be used for leading an embedded wiring. For example, a damascene structure which is formed in the following manner can be employed: a low resistance material containing aluminum, copper, silver, or the like is reflowed to be embedded in the groove, and etching is performed to reach the upper portion of the groove by a CMP (chemical mechanical polishing) method, so that the low resistance material is formed only in the groove.

A "contact hole" means an opening portion for connecting a semiconductor region or a conductive region and a wiring.

Then, the conductive film 108 is formed to have a thickness of greater than or equal to 20 nm and less than or equal to 600 nm, preferably greater than or equal to 40 nm and less than or equal to 200 nm. Since the conductive film 108 is used as a material which is reflowed, the conductive film 108 needs to have a certain thickness, which is described below. However, if the conductive film 108 is too thick, it takes time for forming and processing the conductive film 108; thus, the conductive film 108 has a minimum thickness necessary for forming a film after the reflow.

The conductive film 108 can be formed by a sputtering method, or the like.

The conductive film 108 formed by a sputtering method has an overhang shape with respect to the fine groove and the fine contact hole. Therefore, a portion where deposition on the side surfaces and the bottom surface is not performed uniformly and coverage with a wiring is insufficient is generated. Because of this, a portion where a wiring is extremely thin is generated and the wiring is disconnected (see FIG. 2C).

Next, a surface of the conductive film 108 is exposed to plasma which is generated from a mixed gas of an oxidizing gas and a halogen-based gas, whereby the conductive film 108 is oxidized and fluorinated or chlorinated partially or entirely.

For the oxidizing gas, oxygen, water, ozone, nitrous oxide, and the like can be used, for example. For the halogen-based gas, carbon tetrafluoride, sulfur fluoride, nitrogen fluoride, trifluoromethane, octafluorocyclobutane, chlorine, boron trichloride, silicon chloride, carbon tetrachloride, and the like can be used, for example.

Note that when an insulating film containing oxygen or water is used as the insulating film 124, an oxidizing gas can be supplied from the insulating film 124. Alternatively, an oxidizing gas remaining in a chamber for generating plasma may be used.

When an oxidizing gas remaining in a chamber for generating plasma is used, oxygen cleaning is performed in the chamber for generating plasma. An example of conditions of the oxygen cleaning is as follows: the gas flow rate of oxygen is higher than or equal to 100 sccm and lower than or equal to 500 sccm; the ICP power is greater than or equal to 1000 W and less than or equal to 6000 W; the RF bias power is greater than or equal to 0 W and less than or equal to 300 W; the pressure is greater than or equal to 0.4 Pa and less than or equal to 5 Pa; and the treatment time is longer than or equal to 10 seconds and shorter than or equal to 600 seconds, and the treatment is performed at least once and may be repeated 25 times or less.

A dry etching apparatus, a CVD apparatus, or the like can be used for generating plasma. As a method for generating plasma, for example, a parallel plate reactive ion etching (RIE) method, an inductively coupled plasma (ICP) method, an electron cyclotron resonance (ECR) method, or the like can be used.

After the surface of the conductive film 108 is exposed to plasma which is generated from a mixed gas of an oxidizing gas and a halogen-based gas, the surface of the conductive film 108 is exposed to an atmosphere containing water, whereby the conductive film 108 which is oxidized and fluorinated or chlorinated is fluidized partially or entirely and flows into the groove or the contact hole. Then, fluoride or chloride is partially removed and a fluidized portion of the conductive film 108 is solidified, whereby the conductive film 118 is formed to have a thickness of greater than or equal to 1 nm and less than or equal to 600 nm, preferably greater than or equal to 5 nm and less than or equal to 100 nm (see FIG. 2D).

A gas containing water is introduced into an atmosphere where pressure and impurity are controlled, whereby an atmosphere containing water can be made. With the use of the atmosphere where pressure and impurity are controlled, the conductive film 118 with little variation can be formed. As the atmosphere where pressure and impurity are controlled, an atmosphere in a desiccator, a clean room, and a vacuum chamber included in an apparatus can be used. Alternatively, air may be used as the atmosphere containing water.

Figure 2E:
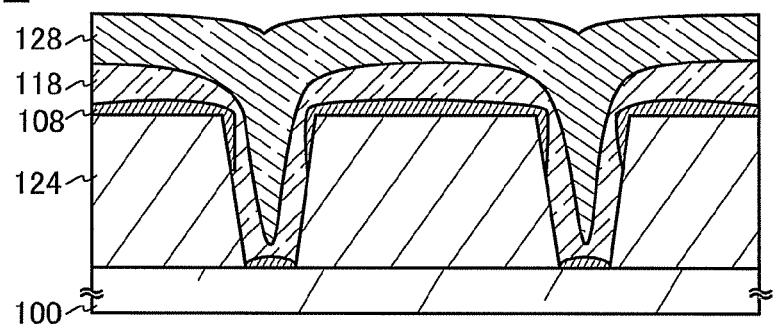

Note that the conductive film 108 is not necessarily provided in FIG. 2E; however, the conductive film 108 which is not reacted is preferably provided between the substrate 100 and the conductive film 118. That is because contact resistance between the conductive film 108 which is not reacted and the substrate 100 can be smaller than contact resistance between the conductive film 118 which is a metal oxide and the substrate 100.

As described in this embodiment, the conductive film 108 is fluidized and then solidified again (also referred to as reflowed), whereby the conductive film 118 is formed; thus, the conductive film 118 can be formed uniformly on the side surfaces and the bottom surface of the groove and the contact hole.

Next, the conductive film 128 is formed to have a thickness of greater than or equal to 50 nm and less than or equal to 1 μm over the conductive film 118, preferably greater than or equal to 100 nm and less than or equal to 700 nm (see FIG. 2E). The conductive film 128 can be used for a lead wiring. The thicker the conductive film 128 is, the smaller the sheet resistance becomes.

Note that the conductive film 128 may be formed by reflow so as to be embedded into the fine groove and the fine contact hole. The conductive film 108 and the conductive film 118 which are diffusion prevention films can be formed uniformly on the side surfaces and the bottom surface of the groove and the contact hole, so that diffusion of a material of the conductive film 128 due to reflow can be suppressed.

Conventionally, reflow is employed only in the case of using a material with a low melting point containing aluminum, copper, silver, and the like; however, as described above, reflow can be utilized also in the case of using a material with a high melting point which is described as the material of the conductive film 108.

According to one embodiment of the present invention, a material in which a metal, an alloy, or a metal compound is oxidized can be formed uniformly on the side surfaces and the bottom surface of the contact hole. Thus, a semiconductor device having favorable electric characteristics can be manufactured with a high yield.

Embodiment 2

Figure 3A:
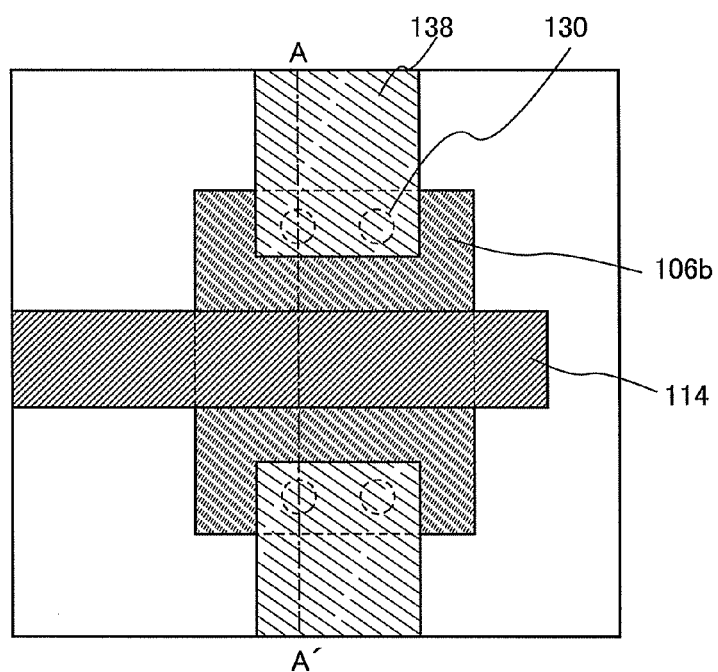
FIGS. 3A and 3B are a plane view and a cross-sectional view showing a semiconductor device according to one embodiment of the present invention.
Figure 3B:
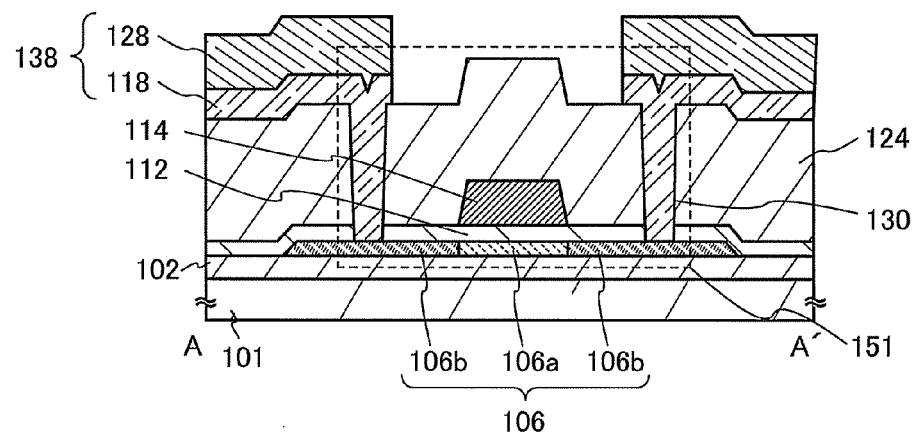

In this embodiment, a planar structure and a cross-sectional structure of a thin film transistor 151 which can be used in a semiconductor device according to one embodiment of the present invention will be described with reference to FIGS. 3A and 3B. FIG. 3A is a plane view and FIG. 3B is a cross-sectional view taken along line A-A' in FIG. 3A. Note that in FIG. 3A, some of components of the thin film transistor 151 (for example, a gate insulating film 112) are omitted for brevity.

The thin film transistor 151 shown in FIGS. 3A and 3B includes a substrate 101, a base insulating film 102 over the substrate 101, a semiconductor film 106 over the base insulating film 102, the gate insulating film 112 covering the semiconductor film 106, a gate electrode 114 over the semiconductor film 106 provided with the gate insulating film 112 therebetween, an insulating film 124 covering the gate insulating film 112 and the gate electrode 114, a contact hole 130 formed in the insulating film 124 and the gate insulating film 112, and a wiring 138 connected to the semiconductor film 106 through the contact hole 130 over the insulating film 124.

The wiring 138 has a structure in which a conductive film 118 and a conductive film 128 are stacked. The conductive film 118 comprises one or more metal elements selected from titanium, nickel, zinc, gallium, zirconium, niobium, molybdenum, indium, tin, and tungsten. The conductive film 118 is formed between a semiconductor film and a second conductive film, whereby diffusion of a material of the second conductive film into the semiconductor film can be suppressed. Note that a conductive film may be provided between the semiconductor film 106 and the conductive film 118. The conductive film comprises one or more metal elements selected from titanium, nickel, zinc, gallium, zirconium, niobium, molybdenum, indium, tin, and tungsten.

As the substrate 101, a glass substrate; a ceramic substrate; a plastic substrate which has high heat resistance enough to withstand a process temperature of this manufacturing process; or the like can be used. In the case where the substrate does not need a light-transmitting property, a metal substrate, such as a stainless steel alloy substrate, provided with an insulating film on its surface may be used. As the glass substrate, for example, an alkali-free glass substrate made of barium borosilicate glass, aluminoborosilicate glass, aluminosilicate glass, or the like may be used. Note that there is no limitation on the size of the substrate 101. For example, any of glass substrates of the third to tenth generations which are often used in the field of the flat panel display can be used.

The base insulating film 102 can be formed using a single-layer structure or a stacked-layer structure of a silicon oxide film, a silicon oxynitride film, a silicon nitride oxide film, a silicon nitride film, an aluminum oxide film, an aluminum nitride film, or the like. For example, when the base insulating film 102 has a structure in which a silicon nitride film and a silicon oxide film are stacked, entry of moisture or a metal impurity from the substrate to the thin film transistor 151 can be prevented.

As the semiconductor film 106, an amorphous silicon film, a microcrystalline silicon film, a polycrystalline silicon film, a single crystal silicon film, an amorphous germanium film, a microcrystalline germanium film, a polycrystalline germanium film, a single crystal germanium film, a mixture film thereof, or the like can be used.

Note that the semiconductor film 106 may have impurity semiconductor regions 106b functioning as a source region and a drain region and a channel region 106a provided therebetween.

The gate insulating film 112 can have a structure similar to that of the base insulating film 102. The gate insulating film 112 can be formed using a high-dielectric constant (high-k) material having higher dielectric constant than silicon oxide. It is known that when the thickness of a gate insulating film becomes smaller in accordance with the scaling law to less than or equal to 5 nm, leakage current in a thin film transistor is increased due to tunneling current. The use of a high-k material for the gate insulating film makes it possible to reduce leakage current even when an equivalent oxide thickness (EOT) is less than or equal to 5 nm. Materials containing yttrium oxide, zirconium oxide, lanthanum oxide, hafnium oxide, or tantalum oxide are known as a high-k material.

Hafnium oxide containing nitrogen and silicon or hafnium oxide containing nitrogen and aluminum is preferably used.

The gate electrode 114 can be formed as a single layer or a stacked layer using a metal film containing such as molybdenum, titanium, chromium, tantalum, tungsten, aluminum, copper, neodymium, scandium, or nickel or an alloy film mainly containing any of these materials. Further, a semiconductor material typified by polycrystalline silicon that is doped with an impurity element such as phosphorus, an alloy of silver, palladium, and copper, an alloy of aluminum and neodymium, an alloy of aluminum and nickel, and the like may be used.

The gate insulating film 124 can have a structure similar to that of the base insulating film 102. As the insulating film 124, an organic film containing a polyimide-based resin, an acrylic-based resin, a siloxane-based resin, or the like can be used.

The insulating film 124 and the gate insulating film 112 have a contact hole reaching the semiconductor film 106.

According to this embodiment, a diffusion prevention film can be uniformly formed on the side surfaces and the bottom surface of the contact hole; thus, even when a wiring material with a low resistance is used, an increase of off-state current due to diffusion of the wiring material with a low resistance into a semiconductor film or to the periphery of the semiconductor film can be suppressed. Accordingly, a semiconductor device having favorable electric characteristics can be manufactured with a high yield.

Embodiment 3

A method for manufacturing the thin film transistor 151 described in Embodiment 2 will be described with reference to FIGS. 4A to 4E and FIGS. 5A to 5C.

First, the substrate 101 is prepared.

In the case where a thin film transistor is provided over a flexible substrate as the substrate 101, either of the following methods is employed: a method in which a thin film transistor is directly formed over a flexible substrate; and a method in which a thin film transistor is formed over a substrate other than a flexible substrate and then separated from the substrate and transferred onto a flexible substrate. Note that in order to separate the thin film transistor to transfer it to the flexible substrate, a separation layer is preferably formed between the different substrate and the thin film transistor.

Figure 4A:
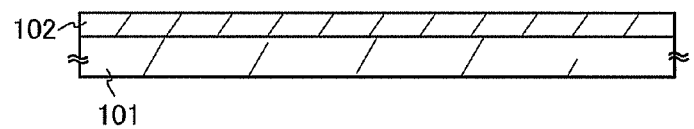
FIGS. 4A to 4E are cross-sectional views showing a method for manufacturing the semiconductor device according to one embodiment of the present invention.

Next, the base insulating film 102 is formed over the substrate 101 (see FIG. 4A). As the base insulating film 102, a film which can reduce diffusion of impurities such as alkali metal and alkaline earth metal from the substrate 101 to the thin film transistor 151 is preferably used. For example, a silicon nitride oxide film is formed over the substrate 101, and a silicon oxynitride film is formed thereover. The thickness of the base insulating film 102 is greater than or equal to 50 nm and less than or equal to 1 μm, preferably greater than or equal to 100 nm and less than or equal to 300 nm. The base insulating film 102 can be formed by a CVD method or a sputtering method.

Figure 4B:
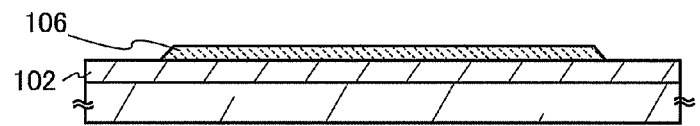

Next, the semiconductor film 106 is formed over the base insulating film 102 (see FIG. 4B). The thickness of the semiconductor film 106 is greater than or equal to 5 nm and less than or equal to 300 nm, preferably greater than or equal to 30 nm and less than or equal to 100 nm. The semiconductor film 106 can be formed by a CVD method or a sputtering method.

Note that an SOI substrate can be used for the substrate 101, the base insulating film 102, and the semiconductor film 106. In that case, a thermal oxide film may be used as the base insulating film 102.

In addition, the semiconductor film 106 may be irradiated with laser light to improve the degree of crystallization. Here, the semiconductor film 106 is irradiated with excimer laser light (XeCl: a wavelength of 308 nm). A beam with a wavelength of 400 nm or less is preferably used as the laser light. As such laser light, for example, excimer laser light such as XeCl excimer laser light, the second harmonic or the third harmonic of a YAG laser, or the like can be used. Before the laser light irradiation, an oxide film formed on a surface of the semiconductor film 106 is preferably removed using dilute hydrofluoric acid or the like.

Next, the gate insulating film 112 is formed to cover the semiconductor film 106. The gate insulating film 112 can be formed by a CVD method or a sputtering method.

Figure 4C:
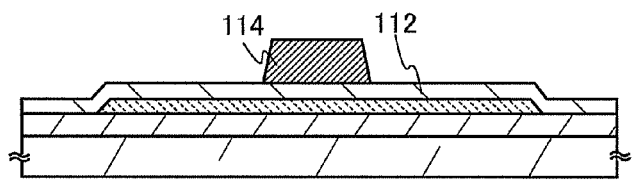
Figure 4D:
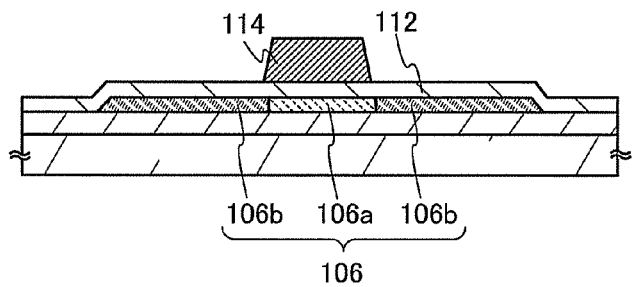
Figure 4E:
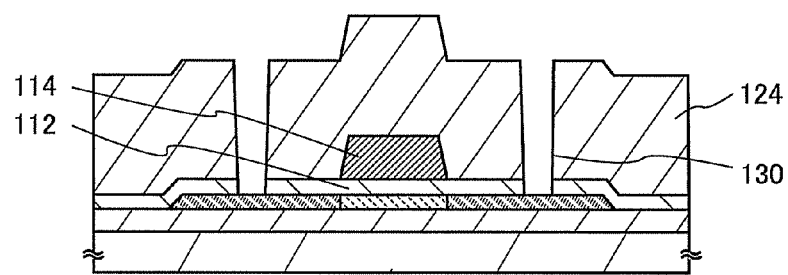

Next, the gate electrode 114 is formed over the semiconductor film 106 with the gate insulating film 112 provided therebetween (see FIG. 4C). The gate electrode 114 can be formed by a sputtering method.

Then, impurity semiconductor regions 106b functioning as a source region and a drain region can be formed by using the gate electrode 114 as a mask and introducing an impurity into the semiconductor film 106 through the gate insulating film 112. At the same time, the channel region 106a is formed below the gate electrode 114 in the semiconductor film 106 (see FIG. 4D).

In the case where an impurity which is introduced into the semiconductor film 106 is boron, aluminum, gallium, or the like, the thin film transistor 151 becomes a p-channel thin film transistor. In the case where an impurity which is introduced into the semiconductor film 106 is phosphorus, arsenic, or the like, the thin film transistor 151 becomes an n-channel thin film transistor.

Next, the insulating film 124 is formed. The insulating film 124 can be formed by a CVD method, a sputtering method, or a coating method.

The insulating film 124 can be formed to have the following structure, for example: a silicon oxynitride film is formed as a first layer to have a thickness of greater than or equal to 10 nm and less than or equal to 200 nm, a silicon nitride oxide film is formed as a second layer to have a thickness of greater than or equal to 20 nm and less than or equal to 200 nm, and a silicon oxynitride film is formed as a third layer to have a thickness of greater than or equal to 100 nm and less than or equal to 1 μm.

In the formation of the insulating film 124, an activation treatment of the impurity introduced into the semiconductor film 106 may be performed after the silicon oxynitride film of the first layer is formed. The activation treatment can be performed by performing heat treatment at higher than or equal to 400° C. and lower than the strain point of the substrate, for example. Here, since the silicon oxynitride film is formed over the gate electrode 114, oxidization of the gate electrode 114 can be suppressed, whereby a drop in operation speed of the thin film transistor due to increase of wiring resistance can be prevented.

In the formation of the insulating film 124, hydrogen concentration of the silicon nitride oxide film of the second layer is preferably greater than or equal to $1 \times 10^{21}$ atoms/cm$^3$. Hydrogen is contained at a concentration of higher than or equal to $1 \times 10^{21}$ atoms/cm$^3$ in the silicon nitride oxide film of the second layer, and thus hydrogenation treatment of the semiconductor film 106 can be performed after the silicon nitride oxide film is formed. For example, heat treatment is performed at higher than or equal to 300° C. and lower than or equal to 550° C. in the state where the silicon nitride oxide film is provided, so that hydrogen in the silicon nitride oxide film can be diffused into the semiconductor film 106 and the interface between the semiconductor film 106 and the gate insulating film 112. Note that the hydrogenation treatment may be performed at any timing as long as it is performed after the silicon nitride oxide film of the second layer is formed. In addition, the hydrogenation treatment can serve as the activation treatment of the impurity introduced into the semiconductor film 106.

In the formation of the insulating film 124, the silicon oxynitride film of the third layer is provided for relieving stress, improving adhesion, and the like.

Next, the contact hole 130 penetrating the insulating film 124 and the gate insulating film 112 is formed. The contact hole 130 is formed by etching the insulating film 124 and the gate insulating film 112 with the use of a resist mask which is formed over the insulating film 124 by a photolithography method. Ultraviolet, a KrF laser light, an ArF laser light, or the like is preferably used for light exposure for forming the resist mask.

In the case where light exposure is performed so that the diameter of a contact hole is less than 25 nm, the light exposure at the time of forming the resist mask is preferably performed using, for example, extreme ultraviolet having an extremely short wavelength of several nanometers to several tens of nanometers.

Wet etching or dry etching can be used for etching of the insulating film 124 and the gate insulating film 112. Dry etching is preferably used. With dry etching, shape of the fine groove and the fine contact hole can be easily controlled. Etching is performed while side walls of the resist mask are made to recede, so that the fine groove and the fine contact hole can be tapered (see FIG. 4E).

Note that the maximum diameter of the contact hole 130 is preferably made smaller for saving size of the thin film transistor. For example, as the maximum diameter of the contact hole 130 is increased, the size of the thin film transistor is also increased. The smaller the maximum diameter of the contact hole 130 is, the better; however, if the diameter is too small, an increase in resistance is caused due to a thin wiring. Thus, the maximum diameter of the contact hole 130 is greater than or equal to 20 nm and less than or equal to 1 μm, preferably greater than or equal to 50 nm and less than or equal to 300 nm.

Next, the conductive film 108 connected to the semiconductor film 106 through the contact hole 130 is formed over the insulating film 124. In this embodiment, the conductive film 108 has a thickness of greater than or equal to 20 nm and less than or equal to 600 nm, preferably greater than or equal to 40 nm and less than or equal to 200 nm. Since the conductive film 108 is used as a material which is reflowed, the conductive film 108 needs to have a certain thickness, which is described below. However, if the conductive film 108 is too thick, it takes time for forming and processing the conductive film 108; thus, the conductive film 108 has a minimum thickness necessary for forming a film after the reflow.

The conductive film 108 can be formed by a sputtering method, or the like. In a sputtering method, particles for forming a film move almost linearly from a target which is a material of the film to a substrate. For this reason, the upper portion of the fine contact hole 130 has an overhang shape, so that a portion where film coverage is insufficient is generated in the contact hole (see FIG. 5A). In such a state, when the conductive film 108 is used for the wiring of the thin film transistor 151, wiring resistance is increased in the portion where film deposition is insufficient, whereby operation speed of the thin film transistor 151 is reduced. Further, the thin film transistor 151 does not operate in some cases.

In view of this, a conductive film is formed uniformly on the side surfaces and the bottom surface of the contact hole by performing treatment on the conductive film 108 described below.

A surface of the conductive film 108 is exposed to plasma which is generated from a mixed gas of an oxidizing gas and a halogen-based gas, whereby the conductive film 108 is oxidized and fluorinated or chlorinated partially or entirely.

Note that oxygen cleaning is performed in advance in a chamber for generating plasma, so that oxygen remains in the chamber for generating plasma and the oxygen can be utilized as an oxidizing gas.

Next the surface of the conductive film 108 is exposed to plasma which is generated from a mixed gas of an oxidizing gas and a halogen-based gas and then is exposed to an atmosphere containing water, whereby the conductive film 108 which is oxidized and fluorinated or chlorinated is fluidized partially or entirely and flows into the contact hole 130. Then, fluoride or chloride is partially removed and a fluidized portion of the conductive film 108 is solidified (also referred to as reflowed), whereby the conductive film 118 is formed (see FIG. 5B). The thickness of the conductive film 118 depends on the thickness of the conductive film 108 and conditions of the plasma treatment. The conductive film 118 is formed so that a total thickness of the conductive film 118 and the conductive film 108 is greater than or equal to 1 nm and less than or equal to 600 nm at the thinnest portion, preferably greater than or equal to 5 nm and less than or equal to 100 nm.

Next, the conductive film 128 is formed over the conductive film 118. Typically, an aluminum film, a copper film, a silver film, or an alloy film of these can be used as the conductive film 128. The thickness of the conductive film 128 is greater than or equal to 50 nm and less than or equal to 1 μm, preferably greater than or equal to 100 nm and less than or equal to 700 nm. The conductive film 128 can be used for a lead wiring. The thicker the conductive film 128 is, the smaller the sheet resistance becomes; thus, a drop in operation speed of the thin film transistor due to increase of wiring resistance can be prevented. The conductive film 128 can be formed by a sputtering method or the like.

Figure 5A:
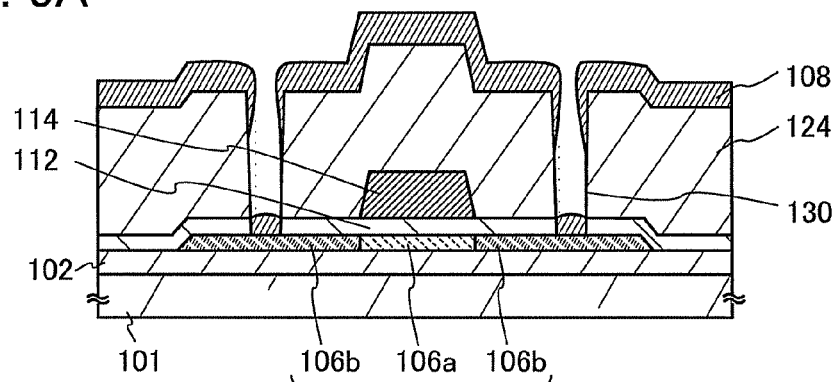
FIGS. 5A to 5C are cross-sectional views showing a method for manufacturing the semiconductor device according to one embodiment of the present invention.
Figure 5B:
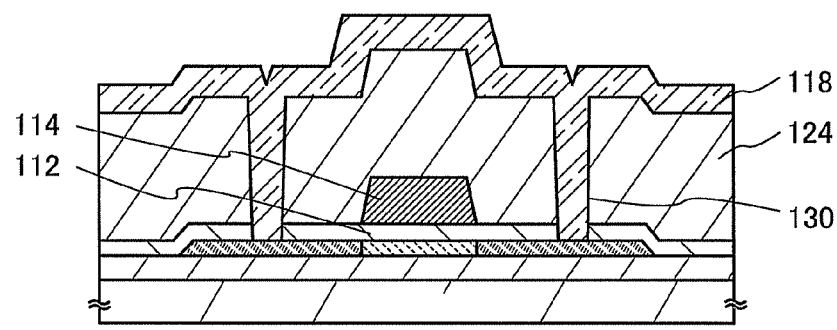
Figure 5C:
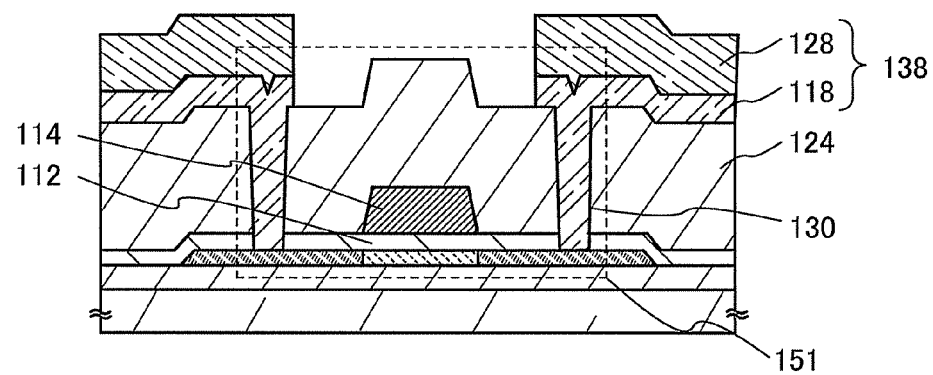

Next, a resist mask is formed over the conductive film 128 by a photolithography method, an inkjet method, or the like, and the conductive film 128 and the conductive film 118 are etched using the mask, whereby the wiring 138 can be formed (see FIG. 5C).

Note that the conductive film 108 which is not reacted may be formed between the semiconductor film 106 and the conductive film 118. Provision of the conductive film 108 between the semiconductor film 106 and the conductive film 118 makes it possible to reduce contact resistance between the semiconductor film 106 and the conductive film 118.

In this embodiment, at least either the conductive film 108 or the conductive film 118 serves as a diffusion prevention film. With the diffusion prevention film, diffusion of the material of the conductive film 128 into the semiconductor film 106 can be suppressed, whereby an increase of off-state current of the thin film transistor can be suppressed, which is preferable.

According to this embodiment, a diffusion prevention film can be uniformly formed on the side surfaces and the bottom surface of the contact hole; thus, even when the conductive film 128 with a low resistance is used, an increase of off-state current of the thin film transistor due to diffusion of the material of the conductive film 128 into the semiconductor film 106 or to the periphery of the semiconductor film 106 can be suppressed. Accordingly, a semiconductor device having favorable electric characteristics can be manufactured with a high yield.

Note that in this embodiment, a method for manufacturing a thin film transistor constituted by one channel type is only described; however, when this embodiment is utilized for a semiconductor device of a complementary metal oxide semiconductor (CMOS) in which two thin film transistors of different channel types are combined, a semiconductor device having favorable electric characteristics can be manufactured with a high yield.

Embodiment 4

One embodiment of the semiconductor device shown in any of the above embodiments will be described with reference to FIGS. 6A to 6F.

As one embodiment of the semiconductor device, the present invention can be applied to a semiconductor device or the like provided with a calculation function that can transmit and receive data without contact, which is also called a micro processor, an RFID tag, an ID tag, an IC tag, an IC chip, an RF tag, a wireless tag, an electronic tag, or a wireless chip.

As examples of the semiconductor device, the following electronic appliances can be given: a camera such as a video camera or a digital camera, a head-mounted display (a goggle-type display), a car navigation system, a projector, a car stereo, a personal computer, and a portable information terminal (such as a mobile computer, a cellular phone, or an e-book reader). Examples thereof are shown in FIGS. 6A to 6E.

Figure 6A:
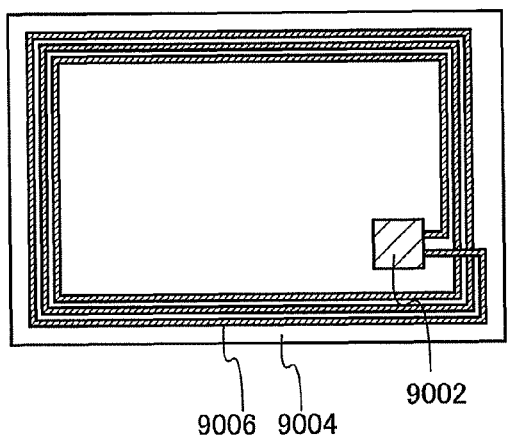
FIGS. 6A to 6F are each an example of an electronic device using a semiconductor device according to one embodiment of the present invention.

An RFID tag shown in FIG. 6A includes a film 9004, an antenna 9006, a functional circuit 9002, and the like. By applying the semiconductor device of Embodiment 3, a high performance and highly reliable RFID tag can be provided.

Figure 6B:
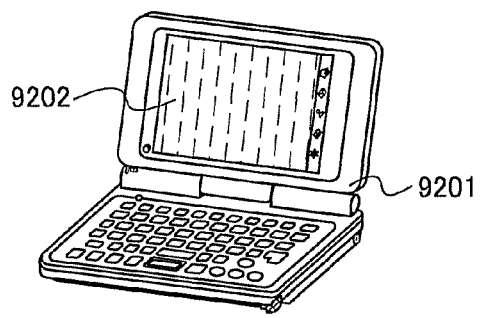

A portable information terminal shown in FIG. 6B includes a main body 9201, a display portion 9202, and the like. By applying the semiconductor device of Embodiment 3, a high performance and highly reliable portable information terminal can be provided.

Figure 6C:
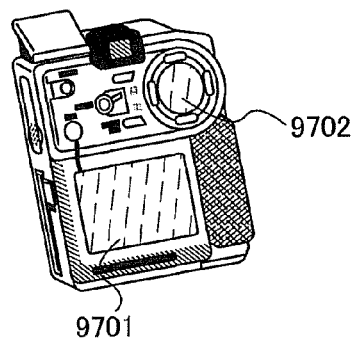

A digital video camera shown in FIG. 6C includes a display portion 9701, a display portion 9702, and the like. By applying the semiconductor device of Embodiment 3, a high performance and highly reliable digital video camera can be provided.

Figure 6D:
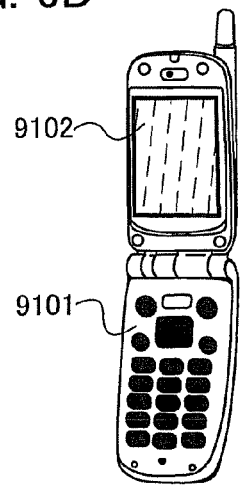

A cellular phone shown in FIG. 6D includes a main body 9101, a display portion 9102, and the like. By applying the semiconductor device of Embodiment 3, a high performance and highly reliable cellular phone can be provided.

Figure 6E:
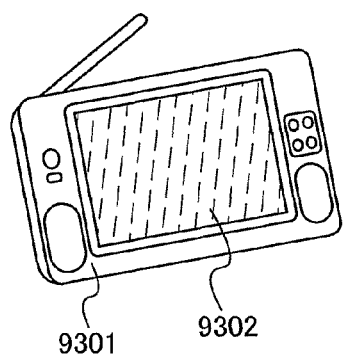

A portable television device shown in FIG. 6E includes a body 9301, a display portion 9302, and the like. By applying the semiconductor device of Embodiment 3, a high performance and highly reliable portable television device can be provided. The semiconductor device of the present invention can be applied widely to various types of television devices including a small-sized television incorporated in a portable terminal such as a cellular phone, a medium-sized television which is portable, and a large-sized television (e.g., 40 inches or more in size).

Figure 6F:
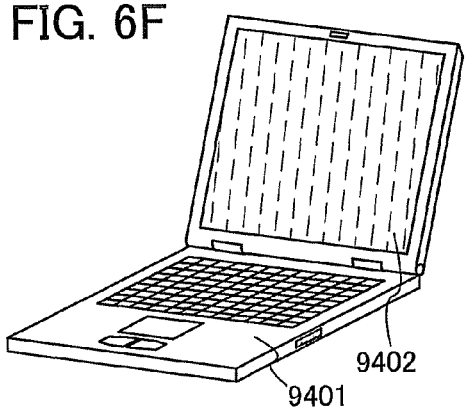

A portable computer shown in FIG. 6F includes a main body 9401, a display portion 9402 and the like. By applying the semiconductor device of Embodiment 3, a high performance and highly reliable portable computer can be provided.

This application is based on Japanese Patent Application serial no. 2010-151894 filed with Japan Patent Office on Jul. 2, 2010, the entire contents of which are hereby incorporated by reference.

What is claimed is:

1. A method for manufacturing a semiconductor device, comprising the steps of:
   forming a second layer over a first layer;
   forming a recessed portion in the second layer, wherein the recessed portion penetrates the second layer;
   forming a first conductive film over the second layer;
   forming a second conductive film by exposing the first conductive film to plasma generated from a mixed gas of an oxidizing gas and a halogen-based gas and oxidizing part of the first conductive film; and
   fluidizing the second conductive film by exposing the second conductive film to an atmosphere containing water so that the second conductive film covers side surfaces of the second layer and part of the first layer in the recessed portion,
   wherein the second conductive film is in electrical contact with the first layer.

2. The method for manufacturing a semiconductor device, according to claim 1, wherein the first conductive film comprises one or more metal elements selected from titanium, nickel, zinc, gallium, zirconium, niobium, molybdenum, indium, tin, and tungsten.

3. The method for manufacturing a semiconductor device, according to claim 1, further comprising the step of:
   forming a third conductive film over the second conductive film,
   wherein the third conductive film comprises at least any one of aluminum, copper, and silver.

4. The method for manufacturing a semiconductor device, according to claim 1, wherein the oxidizing gas is a gas containing at least any one of oxygen, water, ozone, and nitrous oxide.

5. The method for manufacturing a semiconductor device, according to claim 1,
   wherein the second layer contains oxygen or water, and
   wherein the oxidizing gas is supplied from the second layer.

6. The method for manufacturing a semiconductor device, according to claim 1,
   wherein a chamber for generating the plasma includes oxygen, and
   wherein the oxidizing gas is the oxygen contained in the chamber.

7. The method for manufacturing a semiconductor device, according to claim 1, wherein the halogen-based gas contains at least any one of carbon tetrafluoride, sulfur fluoride, nitrogen fluoride, trifluoromethane, octafluorocyclobutane, chlorine, boron trichloride, silicon chloride, and carbon tetrachloride.

8. The method for manufacturing a semiconductor device according to claim 1, wherein the second conductive film is titanium oxide.

9. A method for manufacturing a semiconductor device, comprising the steps of:
   forming a semiconductor film over a substrate;
   forming a insulating film over the semiconductor film;
   forming a recessed portion in the insulating film, wherein the recessed portion penetrates the insulating film;
   forming a first conductive film over the insulating film;
   forming a second conductive film by exposing the first conductive film to plasma generated from a mixed gas of an oxidizing gas and a halogen-based gas and oxidizing part of the first conductive film; and
   fluidizing the second conductive film by exposing the second conductive film to an atmosphere containing water so that the second conductive film covers side surfaces of the insulating film and part of the semiconductor film in the recessed portion.

10. The method for manufacturing a semiconductor device, according to claim 9, wherein the first conductive film comprises one or more metal elements selected from titanium, nickel, zinc, gallium, zirconium, niobium, molybdenum, indium, tin, and tungsten.

11. The method for manufacturing a semiconductor device, according to claim 9, further comprising the step of:
    forming a third conductive film over the second conductive film,
    wherein the third conductive film comprises at least any one of aluminum, copper, and silver.

12. The method for manufacturing a semiconductor device, according to claim 9, wherein the oxidizing gas is a gas containing at least any one of oxygen, water, ozone, and nitrous oxide.

13. The method for manufacturing a semiconductor device, according to claim 9,
    wherein the insulating film contains oxygen or water, and
    wherein the oxidizing gas is supplied from the insulating film.

14. The method for manufacturing a semiconductor device, according to claim 9,
    wherein a chamber for generating the plasma includes oxygen, and
    wherein the oxidizing gas is the oxygen contained in the chamber.

15. The method for manufacturing a semiconductor device, according to claim 9, wherein the halogen-based gas contains at least any one of carbon tetrafluoride, sulfur fluoride, nitrogen fluoride, trifluoromethane, octafluorocyclobutane, chlorine, boron trichloride, silicon chloride, and carbon tetrachloride.

16. The method for manufacturing a semiconductor device according to claim 9, wherein the second conductive film is titanium oxide.

17. A method for manufacturing a semiconductor device, comprising the steps of:
    forming a first film and a second film over a substrate;
    forming a first conductive film over the first film and a second conductive film over the second film;
    oxidizing a surface of the first conductive film and a surface of the second conductive film in a mixed gas containing an oxidizing gas to form a third conductive film and a fourth conductive film over the first conductive film and the second conductive film, respectively; and
    fluidizing the third conductive film and the fourth conductive film by exposing the third conductive film and the fourth conductive film to an atmosphere containing water so that the third conductive film and the fourth conductive film is in contact with each other.

18. The method for manufacturing a semiconductor device, according to claim 17, wherein each of the first conductive film and the second conductive film comprises one or more metal elements selected from titanium, nickel, zinc, gallium, zirconium, niobium, molybdenum, indium, tin, and tungsten.

19. The method for manufacturing a semiconductor device, according to claim 17, further comprising the step of:
    forming a fifth conductive film over the third conductive film and the fourth conductive film,
    wherein the fifth conductive film comprises at least any one of aluminum, copper, and silver.

20. The method for manufacturing a semiconductor device, according to claim 17, wherein the mixed gas further contains a halogen-based gas.

21. The method for manufacturing a semiconductor device, according to claim 17, wherein the oxidizing gas is a gas containing at least any one of oxygen, water, ozone, and nitrous oxide.

22. The method for manufacturing a semiconductor device, according to claim 17,
    wherein the first film and the second film contain oxygen or water, and
    wherein the oxidizing gas is supplied from the first film and the second film.

23. The method for manufacturing a semiconductor device, according to claim 17,
    wherein a chamber includes oxygen, and
    wherein the oxidizing gas is the oxygen contained in the chamber.

24. The method for manufacturing a semiconductor device, according to claim 20, wherein the halogen-based gas contains at least any one of carbon tetrafluoride, sulfur fluoride, nitrogen fluoride, trifluoromethane, octafluorocyclobutane, chlorine, boron trichloride, silicon chloride, and carbon tetrachloride.

25. The method for manufacturing a semiconductor device according to claim 17, wherein the third conductive film and the fourth conductive film are titanium oxide.

* * * * *